(12) United States Patent
Li et al.

(10) Patent No.: US 11,060,928 B2
(45) Date of Patent: *Jul. 13, 2021

(54) LOAD SENSOR AND LOAD SENSOR INTEGRATED TYPE MULTIAXIAL ACTUATOR

(71) Applicant: MINEBEA MITSUMI Inc., Nagano (JP)

(72) Inventors: Kui Li, Yamato (JP); Kotaro Eguchi, Fujisawa (JP)

(73) Assignee: MINEBEA MITSUMI INC., Nagano (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/956,864

(22) PCT Filed: Dec. 26, 2018

(86) PCT No.: PCT/JP2018/047711
§ 371 (c)(1),
(2) Date: Jun. 22, 2020

(87) PCT Pub. No.: WO2019/131700
PCT Pub. Date: Jul. 4, 2019

(65) Prior Publication Data
US 2020/0393310 A1 Dec. 17, 2020

(30) Foreign Application Priority Data
Dec. 26, 2017 (JP) .............................. JP2017-250059

(51) Int. Cl.
*G01L 1/00* (2006.01)
*G01L 1/22* (2006.01)
*H05K 13/04* (2006.01)

(52) U.S. Cl.
CPC .......... *G01L 1/2206* (2013.01); *G01L 1/2287* (2013.01); *H05K 13/04* (2013.01)

(58) Field of Classification Search
CPC ...... G01L 1/2206; G01L 1/2287; H05K 13/04
See application file for complete search history.

(56) References Cited

U.S. PATENT DOCUMENTS 3,927,560 A * 12/1975 Farr .................. G01L 1/2243
73/862.633
4,767,406 A * 8/1988 Wadham ............ A61M 5/1456
604/155

(Continued)

FOREIGN PATENT DOCUMENTS

CN 101432609 A 5/2009
CN 204301899 U 4/2015

(Continued)

OTHER PUBLICATIONS

International Search Report for corresponding International Application No. PCT/JP2018/047711 dated Mar. 26, 2019.

(Continued)

*Primary Examiner* — Max H Noori
(74) *Attorney, Agent, or Firm* — Pearne & Gordon LLP (57) ABSTRACT

Provided is a load sensor that may precisely detect a load of pressing force to an object. A load sensor to be used for a multiaxial actuator (10) that has a drive rod (12) that linearly moves in an axial direction in a state where the drive rod (12) is contained in a housing (11), and a suction rod (22) that is arranged in parallel with the drive rod (12), linearly moves at the same time as the drive rod (12) in the axial direction, and has a tip end portion (22a) to be pressed, when a chip is to be suctioned, against the chip, includes a coupling member (30) that couples the drive rod (12) and the suction rod (22), in which the coupling member (30) has a first coupling part (31) that couples the drive rod (12), and a second coupling part (32) that couples the suction rod (22) in an integrated state, and the first coupling part (31) has a strain body part (311) that is formed to be thinner than the (Continued)

second coupling part (32) and supports the drive rod (12), and strain gauges (41) to (44) attached to the strain body part (311).

4 Claims, 6 Drawing Sheets

(56) References Cited

U.S. PATENT DOCUMENTS

| | | | |
|---|---|---|---|
| 5,285,946 | A | 2/1994 | Tomigashi et al. |
| 9,109,964 | B2 * | 8/2015 | Bao .................. G01L 5/0076 |
| 10,481,057 | B1 * | 11/2019 | Song .................. G01N 3/30 |
| 2009/0033585 | A1 | 2/2009 | Lang |
| 2009/0308180 | A1 | 12/2009 | Hose-Von Wolfframsdorff et al. |
| 2010/0332159 | A1 | 12/2010 | Gortzen et al. |
| 2015/0160080 | A1 | 6/2015 | Fujisawa et al. |
| 2017/0184466 | A1 * | 6/2017 | Liang .................. G01L 3/108 |

FOREIGN PATENT DOCUMENTS

| | | |
|---|---|---|
| CN | 105300588 A | 2/2016 |
| DE | 199 60 786 A1 | 6/2001 |
| JP | 05-191097 A | 7/1993 |
| JP | 2002-299894 A | 10/2002 |
| JP | 2010-034095 A | 2/2010 |
| JP | 2010-034121 A | 2/2010 |
| JP | 2014-018072 A | 1/2014 |

OTHER PUBLICATIONS

Written Opinion for corresponding International Application No. PCT/JP2018/047711 dated Mar. 26, 2019.
Notice of Allowance dated Jun. 10, 2019 for corresponding Japanese Application No. 2017-250059 and English translation.
English translation of the Written Opinion for corresponding International Application No. PCT/JP2018/047711 dated Mar. 26, 2019.
International Preliminary Report on Patentability for corresponding International Application No. PCT/JP2018/047711 dated Jun. 30, 2020.
First Chinese Office Action dated Dec. 18, 2020 for corresponding Chinese Application No. 201880084077.8 and English translation.

* cited by examiner

FIG.6B

LOAD SENSOR AND LOAD SENSOR INTEGRATED TYPE MULTIAXIAL ACTUATOR

TECHNICAL FIELD

The present invention relates to a load sensor and a load sensor integrated type multiaxial actuator, and, for example, relates to a load sensor that detects, in a multiaxial actuator to be used as a chip mounter that mounts an electronic part (chip) to a substrate, pressing force (load) to the chip in a case where the chip is suctioned and mounted to the substrate in a state where the chip is pressed against a tip end of a shaft-like member formed to be hollow, and a load sensor integrated type multiaxial actuator.

BACKGROUND ART

Up to now, as a multiaxial actuator to be incorporated in a chip mounter, a linear motor actuator exists. This linear motor actuator is configured to cause a shaft-like member to perform linear motion in an axial direction by using a linear motor that can obtain linear thrust (For example, see Patent Literature 1).

DOCUMENT LIST

Patent Literature

Patent Literature 1: Japanese Patent Application Publication No. 2014-18072

SUMMARY OF INVENTION

Technical Problem

However, in the linear motor actuator described in the above-mentioned Patent Literature 1, when a chip is pressed against a tip end of a shaft-like member formed to be hollow, the chip is suctioned by taking in air by a vacuum generation apparatus, but when pressing force is insufficient, there is a risk that the attraction might fail, and when the pressing force is excessive, there is a risk that the chip might be damaged. That is, in the linear motor actuator, it is necessary to precisely detect the pressing force (load) such that the chip is pressed at appropriate pressing force.

Accordingly, in view of the aforementioned problem, it is an object of the present invention to provide a load sensor that may precisely detect a load of pressing force to an object, and a load sensor integrated type multiaxial actuator.

Solution to Problem

To achieve the above-mentioned object, a load sensor according to the present invention is a load sensor to be used for a multiaxial actuator that has a first shaft-like member that linearly moves in an axial direction in a state of being contained in a housing, and a second shaft-like member that is arranged in parallel with the first shaft-like member, linearly moves at the same time as the first shaft-like member in the axial direction, and has a tip end portion to be pressed, when a predetermined object is to be suctioned, against the object, the load sensor including a coupling member that couples the first shaft-like member and the second shaft-like member, in which the coupling member has a first coupling part that couples the first shaft-like member, and a second coupling part that couples the second shaft-like member in an integrated state, and the first coupling part has a strain body part that is formed to be thinner than the second coupling part and supports the first shaft-like member, and a strain gauge attached to the strain body part.

According to the present invention, it is preferable to affix the strain gauge to a stress generation area where stress is generated when the tip end portion of the second shaft-like member is pressed against the object in the strain body part.

According to the present invention, it is preferable for the first coupling part to have a coated part where the strain gauge is coated with a predetermined coating material.

A load sensor integrated type multiaxial actuator according to the present invention includes a first shaft-like member that linearly moves in an axial direction in a state of being contained in a housing, a second shaft-like member that is arranged in parallel with the first shaft-like member, linearly moves at the same time as the first shaft-like member in the axial direction, and has a tip end portion to be pressed, when a predetermined object is to be suctioned, against the object, and a coupling member that couples the first shaft-like member and the second shaft-like member to cause the first shaft-like member and the second shaft-like member to linearly move at the same time in the axial direction, in which the coupling member has a first coupling part that couples the first shaft-like member, and a second coupling part that couples the second shaft-like member, and the first coupling part has a strain body part that is formed to be thinner than the second coupling part and supports the first shaft-like member, and a strain gauge attached to the strain body part.

Effects of Invention

According to the present invention, it is possible to realize the load sensor that may precisely detect the load of the pressing force to the object, and the load sensor integrated type multiaxial actuator.

DESCRIPTION OF EMBODIMENTS

<Embodiments>

Figure 1:
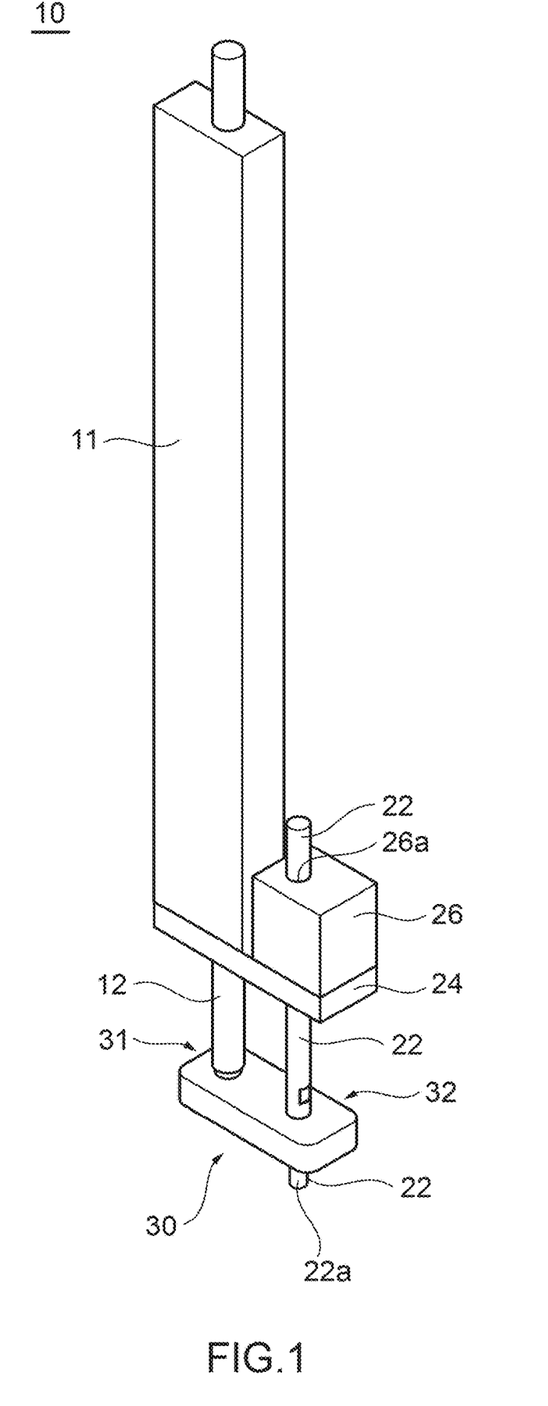
FIG. 1 An external perspective view showing an entire configuration of a load sensor integrated type multiaxial actuator according to an embodiment of the present invention.
Figure 2:
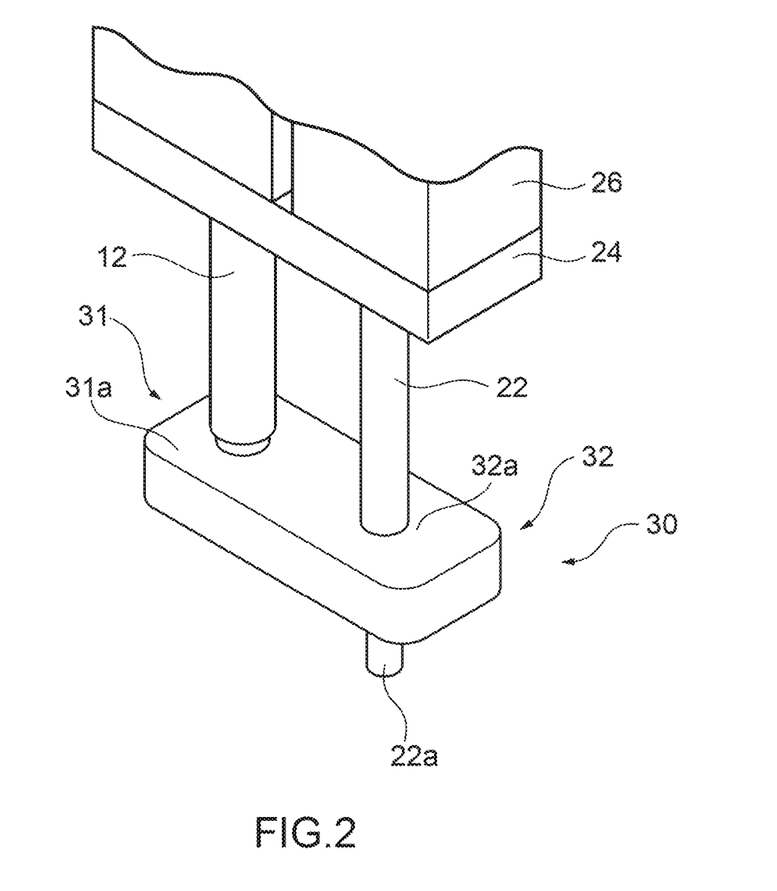
FIG. 2 A schematic partially expanded perspective view showing an external configuration of a coupling member according to the embodiment of the present invention.
Figure 3:
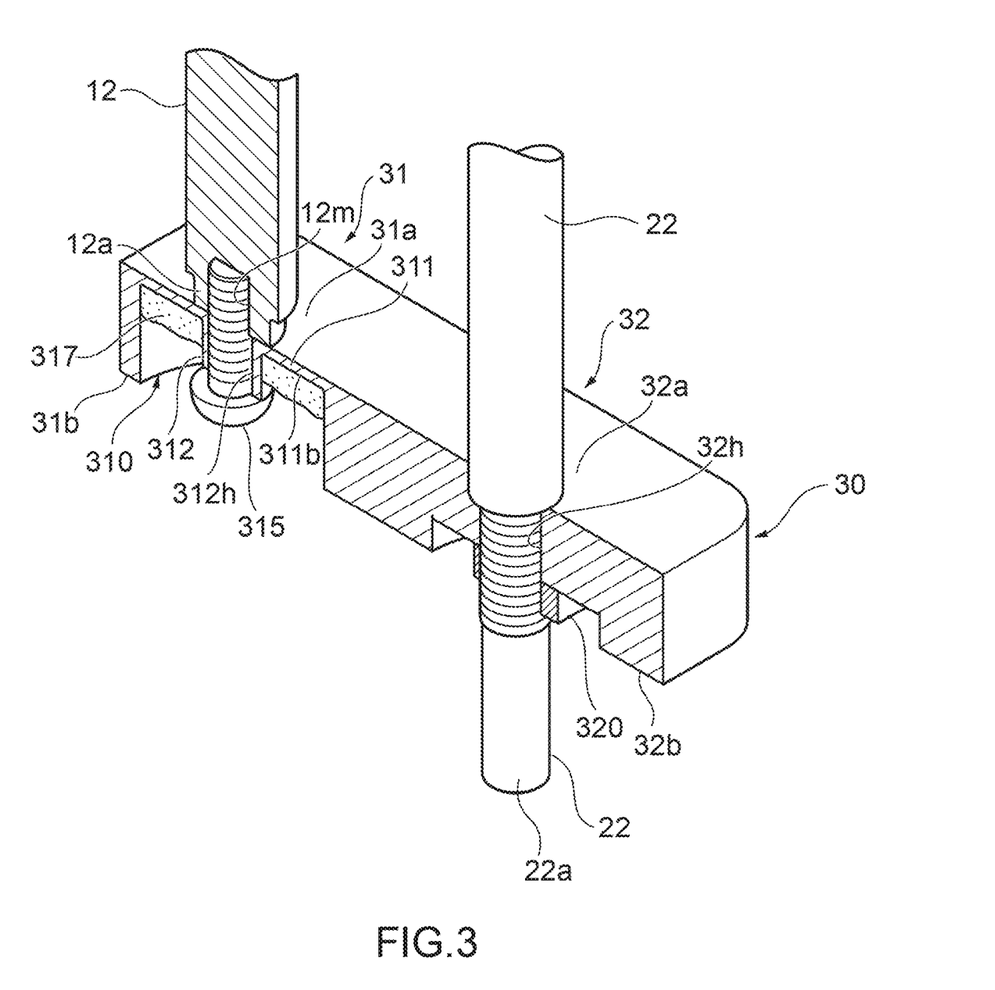
FIG. 3 A schematic partially expanded perspective view showing a cross sectional configuration of the coupling member according to the embodiment of the present invention.
Figure 4A:
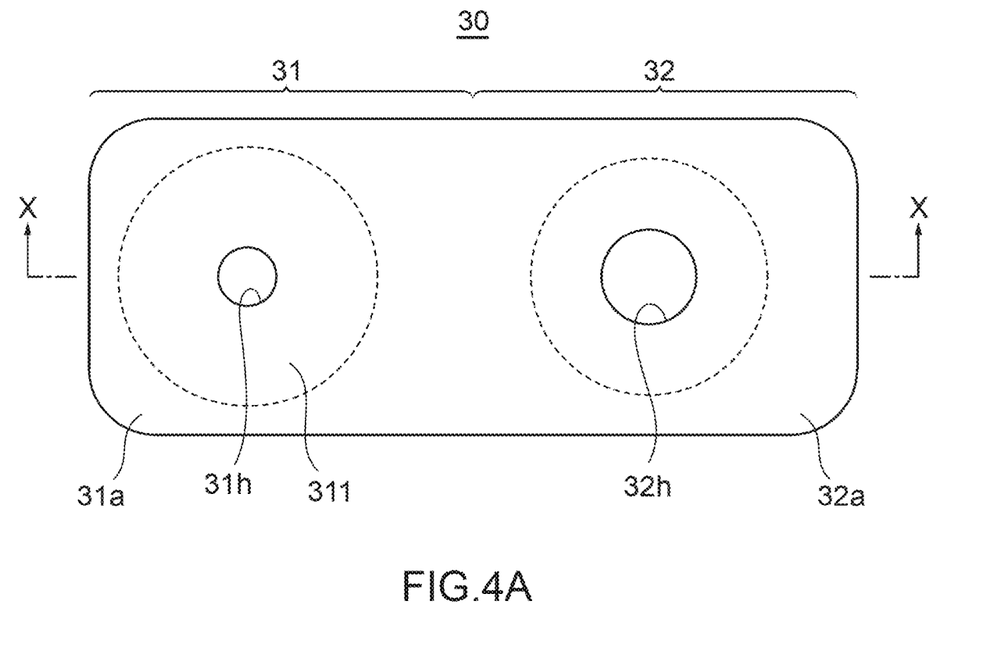
FIGS. 4A and 4B A plan view and a cross sectional view showing a configuration of the coupling member according to the embodiment of the present invention.
Figure 4B:
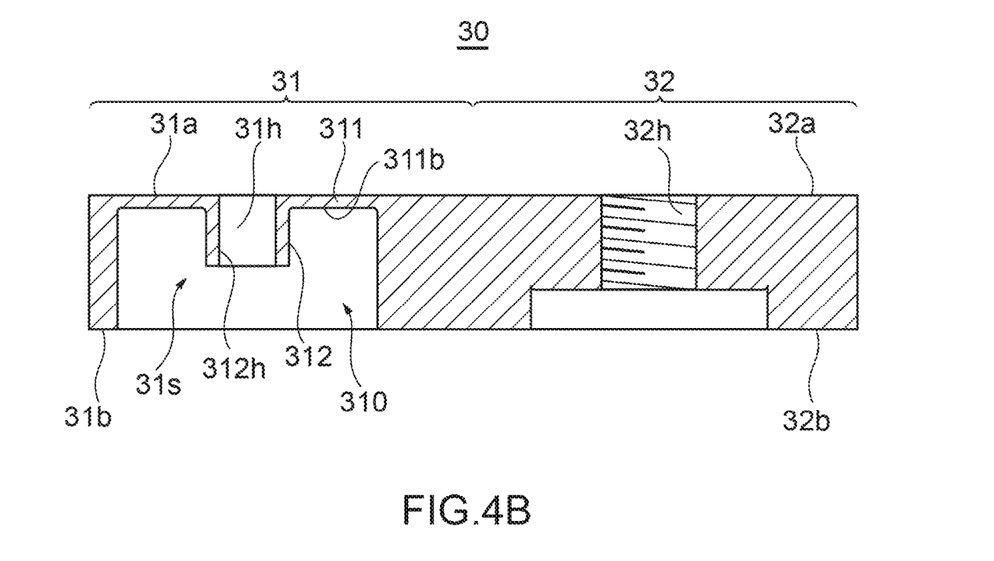
Figure 5A:
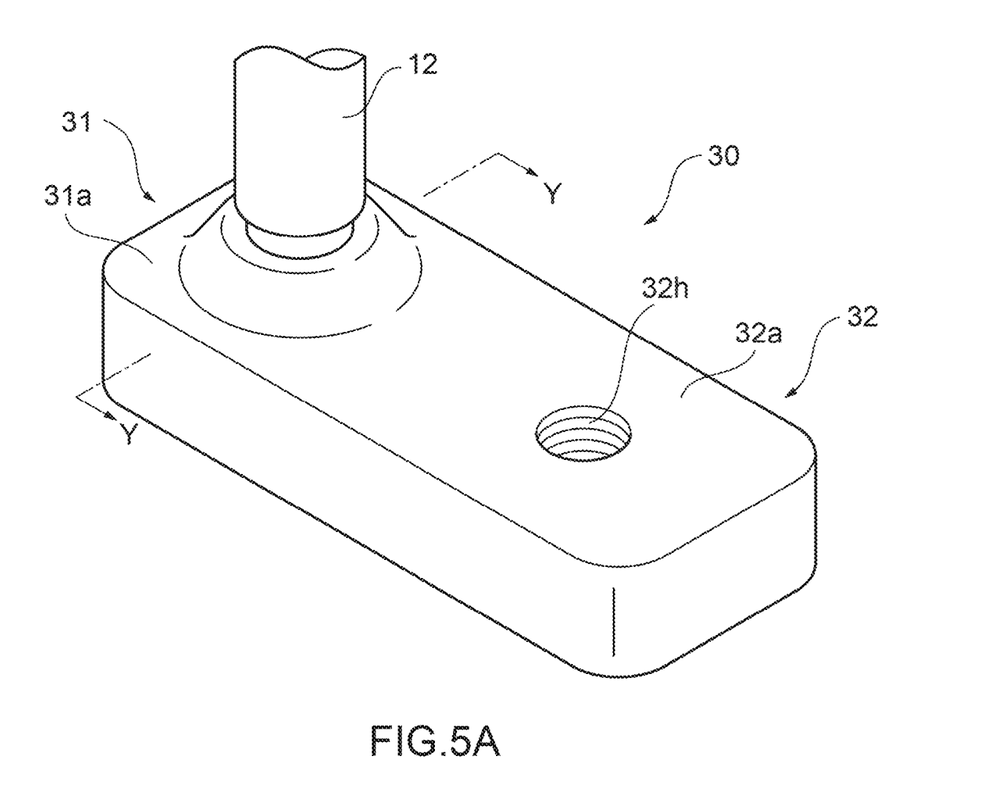
FIGS. 5A and 5B A schematic perspective view and a cross sectional view showing a state where a first coupling part of the coupling member is warped according to the embodiment of the present invention.
Figure 5B:
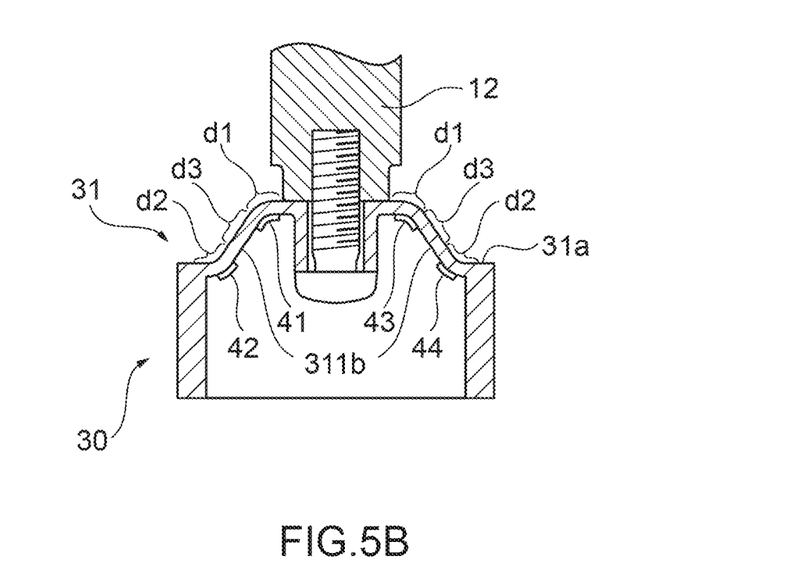
Figure 6A:
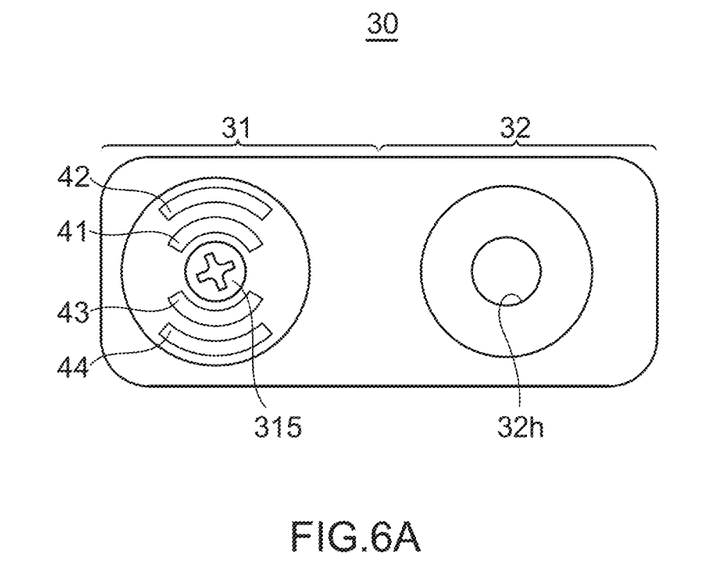
FIGS. 6A and 6B Plan views showing an arrangement of strain gauges affixed to the first coupling part of the coupling member according to the embodiment of the present invention.
Figure 6B:
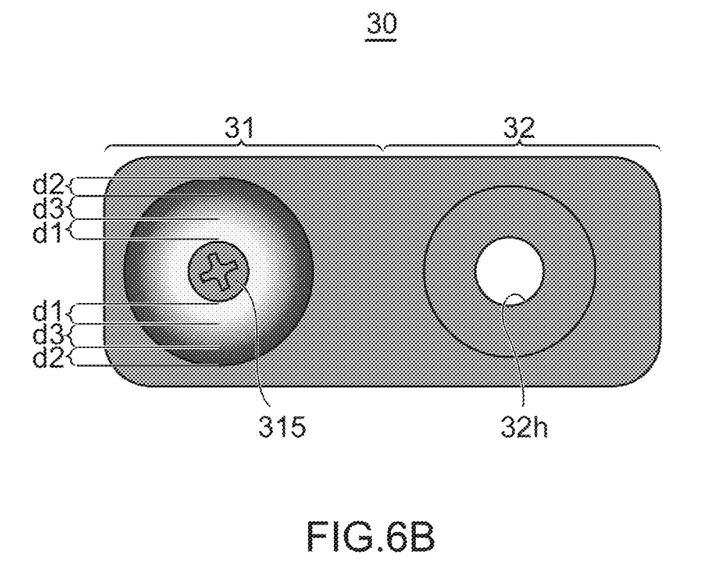

Hereinafter, embodiments of the present invention will be described with reference to the drawings. FIG. 1 is an external perspective view showing an entire configuration of a load sensor integrated type multiaxial actuator according to an embodiment of the present invention. FIG. 2 is a schematic partially expanded perspective view showing an external configuration of a coupling member according to the embodiment of the present invention. FIG. 3 is a schematic partially expanded perspective view showing a cross sectional configuration of the coupling member according to the embodiment of the present invention. FIGS. 4A and 4B are a plan view and a cross sectional view showing a configuration of the coupling member according to the embodiment of the present invention. FIGS. 5A and 5B are a schematic perspective view and a cross sectional view showing a state where a first coupling part of the coupling member is warped according to the embodiment of the present invention. FIGS. 6A and 6B are plan views showing an arrangement of strain gauges affixed to the first coupling part of the coupling member according to the embodiment of the present invention.

<Overall Configuration of Load Sensor Integrated Type Multiaxial Actuator>

As shown in FIG. 1, for example, a load sensor integrated type multiaxial actuator 10 is used by being incorporated in a chip mounter that mounts an object such as an electronic part (chip) onto a substrate.

The load sensor integrated type multiaxial actuator 10 mainly includes, for example, a housing 11 having a three-phase motor (not shown) built therein, a drive rod 12 serving as a first shaft-like member that linearly moves relatively in an axial direction by the three-phase motor, a suction rod 22 that is arranged in parallel with the drive rod 12 and serves as a second shaft-like member that suctions the chip at a tip end, and a coupling member 30 that integrally couples the drive rod 12 and the suction rod 22 on a tip end side and also serves as a load sensor that can detect a load when the chip is pressed against a tip end of the suction rod 22.

The housing 11 is a package that has the above-mentioned three-phase motor built therein and is made of a metal, resin, or the like, and holds the drive rod 12 in a state where the drive rod 12 is allowed to linearly move relatively along the axial direction. It is noted that the housing 11 holds the drive rod 12 via a holding plate 24 (which will be described below).

In actuality, inside the housing 11, a three-phase coil (not shown) constituted by a U phase, a V phase, and a W phase is arranged in the surrounding of the drive rod 12, and when a current flows through the three-phase coil, the drive rod 12 linearly moves in the axial direction relative to the housing 11.

The drive rod 12 is a columnar bar-like member made of a metal, resin, or the like extending along the axial direction, and linearly moves in a predetermined stroke range in a state of being held in the housing 11 via the holding plate 24. In addition, the drive rod 12 has a recessed part that has a predetermined diameter and a predetermined depth and is formed from an end face of a tip end portion 12a towards the axial direction, and a female screw part 12m (FIG. 3) is formed on an inner peripheral surface thereof.

The suction rod 22 is a hollow cylindrical member made of a metal, resin, or the like extending along the axial direction, and is arranged in parallel with the drive rod 12, in which when the chip is to be suctioned, a tip end portion 22a is to be pressed against the chip. The suction rod 22 is attached to a casing 26 via the holding plate 24.

An external diameter of the suction rod 22 has dimension according to a size of the chip, and is smaller than the drive rod 12. However, the configuration is not limited to this, and the external diameter of the suction rod 22 may be larger than an external diameter of the drive rod 12, and may also be substantially the same.

This suction rod 22 is connected to a vacuum pump or the like that is not shown in the drawing via a hose or the like. By the way, a suction pad (not shown) configured to suction the chip may be attached to the tip end portion 22a of the suction rod 22.

The casing 26 is made of a metal, resin, or the like in which a through hole 26a supports such that the suction rod 22 can freely move relatively in the axial direction is formed, and supports such that the suction rod 22 can move in the axial direction along with the motion of the drive rod 12 in the axial direction.

The holding plate 24 has a cuboid shape which is made of a metal, resin, or the like, and is integrally attached to both the housing 11 and the casing 26. The holding plate 24 supports such that the drive rod 12 and the suction rod 22 can move in the axial direction, and also suppresses turning of the suction rod 22 about the drive rod 12 in a state where a mutual positional relationship is held.

As shown in FIG. 2, the coupling member 30 is a plate-like member having a substantially cuboid shape which couples and fixes the tip end portion of the drive rod 12 and the tip end portion of the suction rod 22 and is made of a metal, resin, or the like. The coupling member 30 prevents the drive rod 12 from relatively moving in the axial direction relative to the coupling member 30, and also prevents the suction rod 22 from relatively moving in the axial direction relative to the coupling member 30.

As shown in FIG. 3, the coupling member 30 has a drive rod coupling part 31 serving as a first coupling part that integrally couples and supports in a state where the end face of the tip end portion 12a of the drive rod 12 and a front surface 31a are abutted each other, and a suction rod coupling part 32 serving as a second coupling part that integrally couples and supports in a state where the suction rod 22 penetrates from a front surface 32a to a rear surface 32b.

The drive rod coupling part 31 is a part of the coupling member 30 on one side which is located on an extended line of the axial direction of the drive rod 12, and the suction rod coupling part 32 is a part of the coupling member 30 on another side on an extended line of the axial direction of the suction rod 22. That is, the coupling member 30 is formed as a single rigid body in which the drive rod coupling part 31 and the suction rod coupling part 32 are integrated with each other. This coupling member 30 can be formed by injection molding or cutting.

As shown in FIG. 3 and FIGS. 4A and 4B, the drive rod coupling part 31 and the suction rod coupling part 32 of the coupling member 30 are not actually separated from each other by a boundary between them, but are functional parts virtually divided into two substantially at a center of the coupling member 30.

Therefore, as long as the rigid body having an integrated structure is adopted in which all of a load applied to the drive rod coupling part 31 is transmitted to the suction rod coupling part 32, or all of a load applied to the suction rod coupling part 32 is transmitted to the drive rod coupling part 31, the shape is not limited to the substantially cuboid shape. For example, the coupling member 30 may have a substantially cubic shape, or may also have a substantially circular shape in plan view or a substantially oval shape in plan view which has a predetermined thickness.

In the drive rod coupling part 31, a recessed part space 310 is formed on a rear surface 31*b* on an opposite side to the drive rod 12 in an area opposite to the drive rod 12. The recessed part space 310 of the drive rod coupling part 31 is a space that has a substantially rectangular shape in plan view or a substantially circular shape in plan view and is also formed to be recessed along the axial direction from the rear surface 31*b*.

As a result of the recessed part space 310 being formed, the drive rod coupling, part 31 has a thin-plate like top wall part 311 thinner than the suction rod coupling part 32, and the top wall part 311 has a possibility of being more easily warped than other parts. That is, the top wall part 311 of the drive rod coupling part 31 becomes a part functioning as a strain body in the coupling member 30.

It is noted that a bottom surface 311*b* of the top wall part 311 opposite to the drive rod 12 is a region to which strain gauges 41 to 44 which will be described below are affixed, and is covered by a coating material 317 (FIG. 3) of silicone corresponding to the strain gauges 41 to 44. Accordingly, it is possible to improve dust preventing property and rust preventing property for the strain gauges 41 to 44.

In addition, the drive rod coupling part 31 has a boss part 312 protruding towards an opening of the recessed part space 310 in a center of the bottom surface 311*b* of the top wall part 311. In the boss part 312, a through hole 312*h* that is shaped to be cylindrical having such a length not to protrude from the rear surface 31*b* of the drive rod coupling part 31, and also has a predetermined inner diameter is formed.

A bolt 315 is inserted into the through hole 312*h* of the boss part 312 to couple the drive rod 12 and the drive rod coupling part 31, and a male screw part of the bolt 315 and the female screw part 12*m* corresponding to a hole having a predetermined depth which is formed at the tip end portion 12*a* of the drive rod 12 are screwed together.

Thus, the drive rod 12 is integrally coupled to the drive rod coupling part 31 and supported in a state where the tip end portion 12*a* is abutted against the front surface 31*a* of the drive rod coupling part 31. Accordingly, relative motion of the drive rod 12 in the axial direction relative to the coupling member 30 is suppressed.

In the suction rod coupling, part 32, a through hole 32*h* that has a female screw part to be screwed with a male screw part provided on an outer peripheral surface corresponding to a part of a tip end side of the suction rod 22 is formed on an inner peripheral surface. The through hole 32*h* penetrates from the front surface 32*a* to the rear surface 32*b*.

In the suction rod coupling part 32, the female screw part of the through hole 32*h* and the male screw part of the suction rod 22 are screwed together, and also, the male screw part of the suction rod 22 and a nut 320 are screwed together. Thus, the suction rod 22 is integrally coupled to the suction rod coupling part 32 and supported, and relative motion in the axial direction relative to the coupling member 30 is suppressed.

As shown in FIGS. 5A and 5B and FIGS. 6A and 6B, on the bottom surface 311*b* of the top wall part 311 of the drive rod coupling part 31, the strain gauges 41 to 44 are affixed to most strongly warped parts d1 and d2 when the load applied to the suction rod coupling part 32 is transmitted to the drive rod coupling part 31.

Herein, an entire shape based on the warped parts in the top wall part 311 of the drive rod coupling part 31 becomes a substantially S-letter shape in cross section, and the most strongly warped parts d1 and d2 are parts where the front surface 31*a* of the drive rod coupling part 31 is bent the most, and are stress generation areas more substantially warped than a flat part d3 where bending is less.

The strain gauges 41 to 44 use a change of resistance values when internally arranged resistance elements expand or contract together with a warp (distortion) generated at the top wall part 311 of the drive rod coupling part 31, and the so-called bridge circuit is constituted. In the bridge circuit, it is possible to measure a load according to the warp (distortion) on the basis of a change of a voltage caused by the resistance elements of the strain gauges 41 to 44.

In the load sensor integrated type multiaxial actuator 10, in conjunction with pressing-down of the drive rod 12, the suction rod 22 is pressed down together with the coupling member 30, and when the tip end portion 22*a* of the suction rod 22 is pressed against the chip, reactive force (load) from the chip to the suction rod coupling part 32 becomes a load to the drive rod coupling part 31 to be transmitted.

At this time, since only the top wall part 311 of the drive rod coupling part 31 is warped by the reactive force (load) from the chip, the strain gauges 41 to 44 are previously affixed to the most strongly warped parts (deformed parts) d1 and d2 in the top wall part 311. These warped parts d1 and d2 are parts of the top wall part 311 of the drive rod coupling part 31 having a wall thickness thinner than the suction rod coupling part 32, and function as strain body parts.

It is noted that the strain gauges 41 to 44 are affixed to the warped parts (deformed parts) d1 and d2 on the bottom surface 311*b* of the top wall part 311 of the drive rod coupling part 31, but the configuration is not limited to this. The strain gauges 41 to 44 may be affixed to the warped parts (deformed parts) d1 and d2 on the front surface 31*a* on the opposite side to the bottom surface 311*b* of the top wall part 311, and as long as the load to the suction rod coupling part 32 can be precisely measured, affixation positions of the strain gauges 41 to 44 are not particularly limited.

According to the above-mentioned configuration, the load sensor integrated type multiaxial actuator 10 includes the coupling member 30 serving as a load sensor, and the strain gauges 41 to 44 are affixed to the bottom surface 311*b* of the top wall part 311 where the recessed part space 310 is formed in the drive rod coupling part 31 of the coupling member 30.

As a result of the top wall part 311 of the drive rod coupling part 31 being formed to have a thickness significantly thinner than the suction rod coupling, part 32, since rigidity is lowered, when the tip end portion 22*a* of the suction rod 22 is pressed against the chip, the reactive force (load) from the chip to the suction rod coupling part 32 is directly transmitted to the top wall part 311 of the drive rod coupling part 31 to easily warp.

In particular, since the strain gauges 41 to 44 are affixed to the most strongly warped parts d1 and d2 (strain body parts) in the top wall part 311 of the drive rod coupling part 31, the load sensor integrated type multiaxial actuator 10 can precisely measure pressing force (load) of the suction rod 22 to the chip by the strain gauges 41 to 44 of the coupling member 30.

<Other Embodiments>

It is noted that according to the above-mentioned embodiment, the case has been described where the drive rod coupling part 31 of the coupling member 30 and the drive rod 12 are coupled by the bolt 315, but the present invention is not limited to this. A through hole may be provided in the drive rod coupling part 31 so that the drive rod 12 may be fit to the through hole and coupled, or the drive rod coupling part 31 and the drive rod 12 may be coupled by screw fixing.

In addition, according to the above-mentioned embodiment, the case has been described where the strain gauges 41 to 44 are covered by a coating material 317, but the present invention is not limited to this. Under an environment where it is unnecessary to improve the dust preventing property and the rust preventing property for the strain gauges 41 to 44, the covering by the coating material 317 may be avoided.

The preferred embodiments of the present invention have been described above, but the present invention is not limited to the load sensor integrated type multiaxial actuator 10 and the coupling member 30 according to the above-mentioned embodiment, and includes any mode that may be included in the concept of the present invention and the scope of the claims. In addition, to achieve at least a part of the above-mentioned problem and effects, respective configurations may be appropriately and selectively combined. For example, shapes, materials, arrangements, sizes, and the like of respective components according to the above-mentioned embodiment may be appropriately changed depending on specific use modes of the present invention.

LIST OF REFERENCE SIGNS

10 load sensor integrated type multiaxial actuator
11 housing
12 drive rod (first shaft-like member)
12*a* tip end portion
12*m* female screw part
22 suction rod (second shaft-like member)
22*a* tip end portion
24 holding plate
26 casing
26*a* through hole
30 coupling member (load sensor)
31 drive rod coupling part (first coupling part)
31*a* front surface
31*b* rear surface
32 suction rod coupling part (second coupling part)
32*a* front surface
32*b* rear surface
32*h* through hole
41 to 44 strain gauge
310 recessed part space
311 top wall part (strain body part)
311*b* bottom surface
312 boss part
312*h* through hole
315 bolt
317 coating material
320 nut
d1, d2 warped part
d3 flat part

The invention claimed is:

1. A load sensor to be used for a multiaxial actuator that has a first shaft-like member that linearly moves in an axial direction in a state of being contained in a housing, and a second shaft-like member that is arranged in parallel with the first shaft-like member, linearly moves at the same time as the first shaft-like member in the axial direction, and has a tip end portion to be pressed, when a predetermined object is to be suctioned, against the object, the load sensor comprising:
   a coupling member that couples the first shaft-like member and the second shaft-like member, wherein
   the coupling member has a first coupling part that couples the first shaft-like member, and a second coupling part that couples the second shaft-like member in an integrated state, and
   the first coupling part has a strain body part that is formed to be thinner than the second coupling part and supports the first shaft-like member, and a strain gauge attached to the strain body part.

2. The load sensor according to claim 1, wherein the strain gauge is affixed to a stress generation area in the strain body part where stress is generated when the tip end portion of the second shaft-like member is pressed against the object.

3. The load sensor according to claim 1, wherein the first coupling part has a coated part where the strain gauge is coated with a predetermined coating material.

4. A load sensor integrated type multiaxial actuator comprising:
   a first shaft-like member that linearly moves in an axial direction in a state of being contained in a housing;
   a second shaft-like member that is arranged in parallel with the first shaft-like member, linearly moves at the same time as the first shaft-like member in the axial direction, and has a tip end portion to be pressed, when a predetermined object is to be suctioned, against the object; and
   a coupling member that couples the first shaft-like member and the second shaft-like member to cause the first shaft-like member and the second shaft-like member to linearly move at the same time in the axial direction, wherein
   the coupling member has a first coupling part that couples the first shaft-like member, and a second coupling part that couples the second shaft-like member, and
   the first coupling part has
   a strain body part that is formed to be thinner than the second coupling part and supports the first shaft-like member, and
   a strain gauge attached to the strain body part.

\* \* \* \* \*